US011621720B2

(12) United States Patent
Mueller et al.

(10) Patent No.: US 11,621,720 B2
(45) Date of Patent: Apr. 4, 2023

(54) QUANTUM PROCESSING APPARATUS WITH DOWNSAMPLING ANALOG-TO-DIGITAL CONVERTER

(71) Applicant: International Business Machines Corporation, Armonk, NY (US)

(72) Inventors: Peter Mueller, Zurich (CH); Thomas Morf, Gross (CH); Pier Andrea Francese, Adliswil (CH); Marcel A. Kossel, Reichenburg (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 346 days.

(21) Appl. No.: 17/108,469

(22) Filed: Dec. 1, 2020

(65) Prior Publication Data
US 2021/0175892 A1 Jun. 10, 2021

Related U.S. Application Data

(60) Provisional application No. 62/945,232, filed on Dec. 9, 2019.

(51) Int. Cl.
*H03M 1/12* (2006.01)
*G06N 10/00* (2022.01)
(Continued)

(52) U.S. Cl.
CPC ............ *H03M 1/126* (2013.01); *G01N 24/12* (2013.01); *G01R 33/0358* (2013.01);
(Continued)

(58) Field of Classification Search
CPC ...... H03M 1/126; H03M 1/1205; H03M 1/12; H03M 1/124; H03M 1/66; H03M 1/1285;
(Continued)

(56) References Cited

U.S. PATENT DOCUMENTS

2018/0260732 A1 9/2018 Bloom et al.
2019/0049495 A1* 2/2019 Ofek ..................... G06F 9/3877

OTHER PUBLICATIONS

Ryan et al., "Hardware for Dynamic Quantum Computing," arXiv:1704.08314v1 [quant-ph] Apr. 26, 2017, 13 pages.
(Continued)

*Primary Examiner* — Arnold M Kinkead
(74) *Attorney, Agent, or Firm* — Amin, Turocy & Watson, LLP (57) ABSTRACT

Systems and methods directed to a quantum processing apparatus are provided. The apparatus comprises M solid-state qubits, where M>1, and control electronics, which are connected to the solid-state qubits. The control electronics comprise one or more qubit readout circuits, where each of the qubit readout circuits is connected to at least one of the solid-state qubits and comprises a downsampling analog-to-digital converter (hereafter DSADC). Each DSADC is configured to downsample analog signals obtained from the at least one of the solid-state qubits. Such a DSADC operates in the $n^{th}$ Nyquist zone of the spectrum of the analog signals obtained, so as to down-convert such analog signals from the $n^{th}$ Nyquist zone to the $m^{th}$ Nyquist zone of the spectrum, where $n > m \geq 1$, prior to sampling the analog signals to convert them into digital signals, in operation. One or more embodiments of the invention are further directed to a related method of operating such a quantum processing apparatus.

20 Claims, 5 Drawing Sheets

(51) Int. Cl.
   *H01L 27/18*     (2006.01)
   *G01R 33/035*    (2006.01)
   *H03M 1/66*      (2006.01)
   *H04B 10/70*     (2013.01)
   *G06N 10/40*     (2022.01)
   *G01R 33/24*     (2006.01)
   *G01N 24/12*     (2006.01)
   *G01R 33/32*     (2006.01)

(52) U.S. Cl.
   CPC ........... *G01R 33/24* (2013.01); *G01R 33/323* (2013.01); *G06N 10/00* (2019.01); *G06N 10/40* (2022.01); *H01L 27/18* (2013.01); *H03M 1/12* (2013.01); *H03M 1/124* (2013.01); *H03M 1/1205* (2013.01); *H03M 1/1285* (2013.01); *H03M 1/66* (2013.01); *H04B 10/70* (2013.01)

(58) Field of Classification Search
   CPC ........ G06N 10/00; G06N 10/40; G01N 24/12; H01L 27/18; G01R 33/0358; G01R 33/24; G01R 33/323; H04B 10/70
   USPC ......... 341/126; 327/100, 186; 326/1; 706/62
   See application file for complete search history.

(56) References Cited

OTHER PUBLICATIONS

Homulle et al., "A Recongurable Cryogenic Platform for the Classical Control of Scalable Quantum Computers," arXiv:1602.05786v2 [physics.ins-det] Apr. 24, 2017, 8 pages.

Koch et al., "Charge insensitive qubit design derived from the Cooper pair box," arXiv:cond-mat/0703002v2 [cond-mat.mes-hall] Sep. 26, 2007, 21 pages.

Devoret et al, "Superconducting Qubits: A Short Review," arXiv:cond-mat/0411174v1 [cond-mat.mes-hall] Nov. 7, 2004, 41 pages.

Fink et al., "Quantum-To-Classical Transition in Cavity Quantum Electrodynamics," arXiv:1003.1161v2 [quant-ph] Oct. 21, 2010, 4 pages.

* cited by examiner

QUANTUM PROCESSING APPARATUS WITH DOWNSAMPLING ANALOG-TO-DIGITAL CONVERTER

BACKGROUND

One or more embodiments of the invention relates in general to the field of a quantum processing apparatuses and methods of operation thereof. In particular, it is directed to a quantum computer comprising a downsampling analog-to-digital converter configured to downsample analog signals obtained from qubits of the computer.

Recent advances in quantum computing are making such technology ever more relevant to industrial applications. Quantum computing makes direct use of quantum-mechanical phenomena, such as superposition and entanglement to perform operations on entangled qubits, i.e., states stored in qubits. For example, superconducting circuits are relatively easy to manufacture with current technologies and are thus promising candidates to further scale quantum information technologies. Small quantum computers based on a couple of hundred of superconducting qubits with limited to no error correction are able to simulate quantum systems intractable to conventional computers.

Possible applications on quantum machines include the solving of difficult optimization problems that are beyond the reach of classical algorithms. For example, quantum optimizations based on the variational principle are particularly appealing. In this approach, an objective function is minimized by varying a trial state that depends on a few parameters. Applications to quantum chemistry, metrology tasks or efficient error-syndrome measurements in error correction codes can notably be contemplated. Such examples of applications employ the creation of initial states, as typically utilized in many quantum algorithms e.g., the initial states typically are entangled over many qubits, which, so far, is typically achieved by applying a sequence of single and two-qubit gate operations to a ground state.

For superconducting qubits, better performance is usually achieved with quantum processing apparatuses involving fixed-frequency qubits i.e., in such apparatuses, qubits are operated as fixed-frequency qubits, whereby the frequency of each qubit is typically unique. This property, however, cannot be achieved strictly through the sole physical design of the qubits. In particular, solid-state qubit architectures (e.g., transmon, spin-based, and topological qubits) employ individual biasing (current or voltage) of qubits to tune their energy levels (and thus their frequencies) during the operation of the quantum processing apparatus. Currently, this is achieved using a brute force approach, whereby one bias cable is used for each qubit, i.e., down to the lowest cryostat stage (e.g., the 10-20 milliKelvin (mK) cryostat stage).

A quantum computer includes a number of qubits, such as solid-state qubits, which often needs to be operated at a few mK only. Today, the number of qubits involved is typically in the range of 50 or 100 qubits. Quantum computers will eventually include a larger number of qubits. For a universal quantum computer to perform tasks which cannot be solved with conventional computers, the number of qubits will indeed have to be increased, especially as several physical redundancy qubits are needed to form a logical, error corrected, qubit.

Currently, control of the qubits is achieved using commercially available "test and measurement" equipment. Qubits are controlled and read out individually, which requires a large number of quantum chip inputs and outputs (I/Os), radiofrequency (RF) lines connected to the low-temperature platform comprising the qubits, as well as multiple signal down-converters and analog-to-digital converters (ADCs). The electronics, including the control electronics, is typically arranged on a room-temperature component, due to high power dissipation it causes. The down-converters require frequent calibration because such parts show substantial temperature drift.

SUMMARY

According to a first aspect, one or more embodiments of the present invention is embodied as a quantum processing apparatus. The apparatus comprises M solid-state qubits, where M>1, and control electronics, which are connected to the M solid-state qubits. The control electronics comprise one or more qubit readout circuits, where each of the one or more qubit readout circuits is connected to at least one of the M solid-state qubits and comprises a downsampling analog-to-digital converter (hereafter, "DSADC"). Each DSADC is configured to downsample analog signals obtained from the at least one of the M solid-state qubits. Such a DSADC operates in an $n^{th}$ Nyquist zone of the spectrum of the analog signals obtained, so as to down-convert such analog signals from the $n^{th}$ Nyquist zone to an $m^{th}$ Nyquist zone of the spectrum, where n>m≥1, prior to sampling the analog signals to convert them into digital signals, in operation.

In some embodiments, the control electronics further comprise a signal cancelation unit, or SCU, which includes an digital-to-analog converter, or DAC, wherein the SCU is connected to the at least one of the M solid-state qubits and the DSADC, so as to perform signal cancelation and thereby reduce a carrier amplitude of analog signals down-converted by the DSADC, prior to sampling such signals, in operation.

According to another aspect, one or more embodiments of the invention are embodied as a method of operating a quantum processing apparatus such as described above. That is, the method comprises employing a quantum processing apparatus, the quantum processing apparatus comprising M solid-state qubits, M>1, and control electronics. The control electronics are connected to the M solid-state qubits and comprise one or more qubit readout circuits. Each of the one or more qubit readout circuits is connected to at least one of the M solid-state qubits and comprises a DSADC. Analog signals obtained from the at least one of the M solid-state qubits are downsampled via the DSADC. Again, the DSADC operates in an $n^{th}$ Nyquist zone of the spectrum of the analog signals, so as to down-convert such analog signals from the $n^{th}$ Nyquist zone to an $m^{th}$ Nyquist zone of the spectrum, n>m≥1, prior to sampling the analog signals to convert them into digital signals.

Apparatuses and methods embodying one or more embodiments of the present invention will now be described, by way of non-limiting examples, and in reference to the accompanying drawings.

BRIEF DESCRIPTION OF SEVERAL VIEWS OF THE DRAWINGS

The accompanying figures, where like reference numerals refer to identical or functionally similar elements throughout the separate views, and which together with the detailed description below are incorporated in and form part of the present specification, serve to further illustrate various embodiments and to explain various principles and advantages all in accordance with the present disclosure, in which.

The accompanying drawings show simplified representations of devices or parts thereof, as involved in embodiments. Similar or functionally similar elements in the figures have been allocated the same numeral references, unless otherwise indicated.

DETAILED DESCRIPTION OF EMBODIMENTS OF THE INVENTION

The following description is structured as follows. First, general embodiments and high-level variants are described (sect. 1). The next section addresses more specific embodiments and technical implementation details (sect. 2).

1. General Embodiments and High-Level Variants

An aspect of one or more embodiments of the invention is first described, which concerns a quantum processing apparatus 1, i.e., a quantum computer. The apparatus comprises M solid-state qubits 21, 22, where M>1 i.e., at least two qubits are involved. As used herein, the terms "qubit" and "qubits" denote qubits that include the functionality and/or structure of "solid-state qubits" in one or more embodiments herein. Note, some of the appended drawings assume a two-qubit architecture, for the sake of illustration. Further, it is to be understood that the present solutions preferably involve a fairly large number of qubits, e.g., larger than 50, 100, or even 200, as such solutions become all the more advantageous where a large number of qubits is involved.

Figure 1:
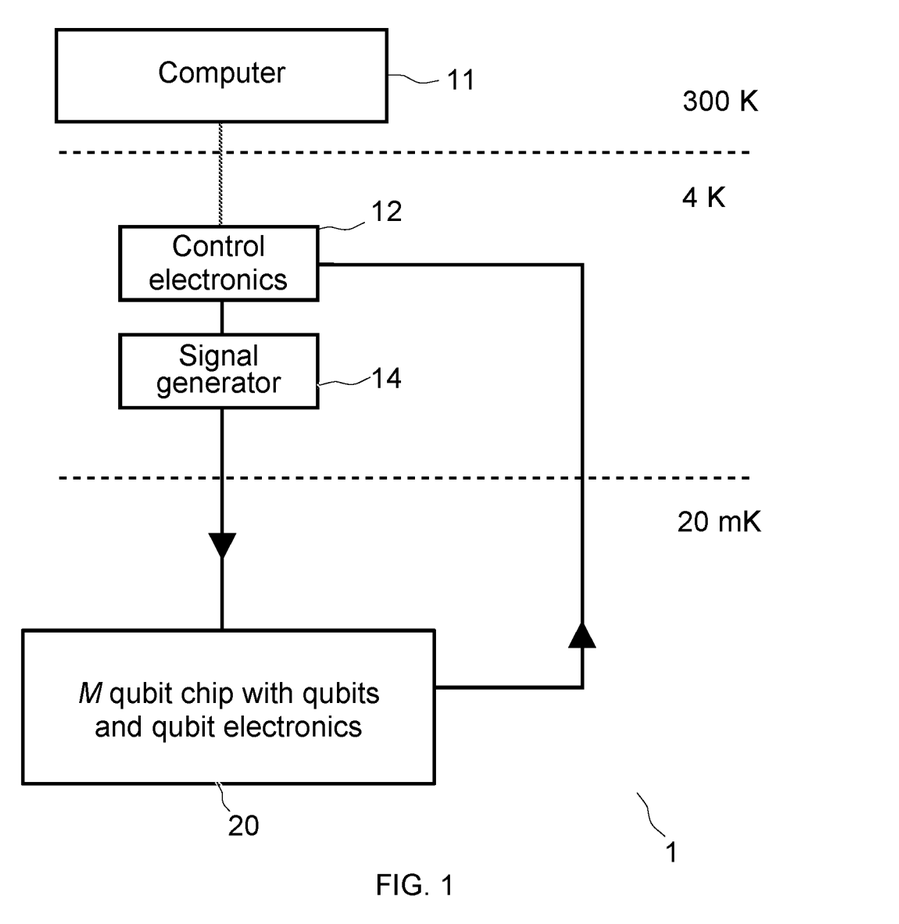
FIG. 1 is a diagram illustrating the general architecture of a quantum processing apparatus according to embodiments.

The apparatus further includes control electronics 12, which are connected to the qubits, as illustrated in FIG. 1. The control electronics comprise one or more qubit readout circuits 125. Each of the circuits is connected to one of the qubits (in single qubit-readout implementation) or to a plurality of such qubits, e.g., two qubits in the illustration examples discussed below.

The control electronics further comprise a downsampling analog-to-digital converter 124, or DSADC. The DSADC 124 is configured to downsample analog signals obtained from the qubits, i.e., from one or more of the solid-state qubits 21, 22, depending on the configuration chosen for the readout circuit 125. The DSADC operates in the $n^{th}$ Nyquist zone of the spectrum of the analog signals obtained from the qubits, so as to down-convert such analog signals from the $n^{th}$ Nyquist zone to the $m^{th}$ Nyquist zone of the spectrum, prior to sampling the analog signals, so as to convert the signals into digital signals, in operation. The DSADC may for instance comprise both an analog-to-digital converter (ADC) and a digital memory connected to the ADC, as assumed in FIG. 2. The digital memory acts as a buffer for the converted signals.

When a readout circuit is connected to a plurality of qubits (as in FIG. 2), then the corresponding DSADC may be configured to downsample time-interleaved and/or frequency-multiplexed analog signals as obtained from the two or more qubits connected to this circuit, or as obtained after combination with cancellation signals by a signal cancelation unit (SCU), as in embodiments discussed later in reference to FIG. 4.

The analog spectrum can be divided in so-called Nyquist zones, which represent slices of bandwidth for the signal. In the present case, the number n and m that identify the Nyquist zones are subject to the constraint $n > m \geq 1$. Each of n and m is preferably an odd number, to avoid frequency inversion, as also discussed in section 2. Thus, n is preferably larger than or equal to 3 ($n \geq 3$). In some embodiments, however, n is larger than or equal to 5, e.g., n=11. The analog signals obtained from the qubits are preferably down-converted to the $1^{st}$ Nyquist zone of the spectrum (m=1).

In some embodiments, as shown in FIG. 1, the quantum processing apparatus comprises three platforms (at least). These include a first platform, on which the qubits are arranged. The first platform is designed to be cooled down at a first temperature $T_1$ (e.g., 20 mK). A second platform is provided, which is designed to be cooled down at a second temperature $T_2$ that is larger than $T_1$. The temperature $T_2$ is typically between 2 and 6 Kelvin (K), e.g., 3 or 4 K. A third platform is operated at a third temperature $T_3$ (e.g., at room temperature), which is larger than $T_2$.

FIG. 1 shows only three platforms, for simplicity. However, one or more intermediate platforms can be used in different embodiments. For example, the first platform can be operated at 20 mK, the second at 3 K, and a further intermediate platform, e.g., operated at 50 K, can be provided below the room-temperature platform.

The control electronics can include electronic components, which can be typically arranged on the second platform and/or the third platform, while the DSADC can be typically arranged on the second platform. The control electronics can for instance interface with a classical computer, as assumed in FIG. 1. In variants, or in addition, other input/output (I/O) devices can be provided, e.g., allowing the quantum processing apparatus to be operated via such I/O devices, in particular from a cloud.

The solid-state qubits can for instance be superconducting quantum circuits, for example, the transmon type. Such qubits are controlled by radio frequency (RF) technology and can be operated at temperatures of a few mK only. The RF signals are typically fed into the cryostat with coax cables. Two channels normally suffice to control the qubits. Attenuators (not shown) are typically placed on intermediate temperature platforms to thermalize the signals on each of the upward and downward path. In variants, the qubits can be configured as spin-based quantum circuits, hereafter spin qubits for short. In other variants, the qubits are topological qubits. In all cases, the platform on which the qubits are arranged is typically meant to be operated at very low temperatures.

Currently, solid-state qubits are controlled and read out individually, because of the relatively small number of qubits as typically involved in current apparatuses. However, when the number of qubits increase, as is already the case with some apparatuses (mostly experimental apparatuses), it is advantageous to implement multiplexed receiver electronics on the qubit platform 20 to reduce the numbers of I/Os required on the quantum chip level 20, RF lines leading to the qubits, and receiver electronics 122, 124. In addition, when a relatively large number of qubits is involved (e.g., M is larger than or equal to 100 or 200), placing part of the control electronics 12 closer to the qubits (e.g., on the 4 K platform in FIG. 1) can reduce the number of electrical connections. In one or more embodiments, placing part of the control electronics closer to the qubits can also result in their real time behavior is improved, this including feedback. On the other hand, at this temperature level, low power dissipation can be employed to keep the refrigerating effort within reasonable limits.

A DSADC as proposed herein allows the ADC power dissipation to be reduced due to the lower sampling rate and thus allows receiver electronics to be placed on a low-temperature platform (e.g., on an intermediate platform, which typically is cooled down to 3 or 4 K).

As said, the DSADC processes signals in the $n^{th}$ Nyquist zone and down-convert them in a lower zone, preferably the $1^{st}$ Nyquist zone. This, in embodiments, is achieved thanks to a combination of a nonlinearity within the DSADC's analog front end (e.g., using a sample-and-hold circuit and a suitable bandwidth limitation), thus eliminating the need of using a down-conversion scheme with a classical mixer. In addition, the DSADC can be used to perform run-time (re-)calibration for simultaneous detection of multiple qubits. Thus, dedicated mixers are no longer required.

There are several advantages in eliminating such mixers. First, the overall thermal power can be reduced since mixers require high operation signals. Second, this further makes it possible to get rid of the algorithm-dependent thermal drift of the mixer, which reduces the required calibration cycles. Moreover, state-of-the-art CMOS technology can be relied on, which is well-suited for the design of ultra-wideband, asynchronous successive-approximation ADCs (SAR ADCs) and ultra-wideband track-and-hold circuits (T & H circuits). Such circuits can be combined to form a DSADC as described above, thus eliminating the need of dedicated hardware performing usual mixer-based down-conversion.

In addition, the clock rate of the DSADC is specified by the frequency-separation between the quantum states single qubit measurement and/or the control with which the qubit resonance frequencies can be adjusted in an array (for multiple qubit measurements).

When a single ADC is used for multiple qubits, as opposed to the classical mixer approach, the detection effort of the DSADC does not scale linearly with the number of qubits. In fact, in embodiments, the proposed downsampling approach is constant and independent of the number of qubits.

The fact that no global clock synchronization mechanism is necessary to implement the proposed approach of down-sampling conversion with a single ADC simplifies significantly the detection effort compared to prior solutions, in which every qubit needs a dedicated down-conversion mixer and clock source that need to be calibrated, which finally requires a global synchronization.

In the input controller (i.e., the controller generating the excitation signal to set a qubit or perform an operation like an x rotation) an excitation signal (e.g., a modulated Gaussian pulse) can be directly synthesized with an ultra-fast arbitrary waveform generator (AWG) 14, implemented as an (integrated) digital-to-analog converter (DAC) with waveform memory at the input.

As discussed below in reference to FIG. 4, further embodiments signals, devices, methods and/or components to cancel parasitic signal components such as a carrier frequency of the excitation signal, crosstalk signals, or other unwanted modulation signals remaining in signals carrying the qubit response. Doing so improves the linearity and dynamic range of the DSADC. This can be achieved thanks to a SCU, including a second DAC that subtracts (after an initial calibration) undesired signals prior to entering the DSADC.

Because the proposed downsampling conversion approach lowers the conversion frequency (e.g., from the $n^{th}$ Nyquist zone to the $1^{st}$ Nyquist zone), less power is required for the supporting electronics e.g., ADC and clocking can be run at lower speeds, which means less thermal power dissipation. This enables the operation of the DSADC at low temperatures (e.g., at single-digit Kelvin) instead of room temperature, if desired. Operation at low temperature improves the signal-to-noise ratio. A lower sampling rate is further advantageous for following low power signal processing control codes.

All this is now described in detail, in reference to particular embodiments of the invention. To start with, the qubits and the DSADC are preferably configured so as for the analog signals to be essentially included in the $n^{th}$ Nyquist zone and the down-converted signals to be essentially included in the $m^{th}$ Nyquist zone i.e., the vast majority or the quasi-totality (if not the totality) of the frequencies of such signals are located in their respective Nyquist zones, to avoid aliasing. If necessary, low-pass filtering is relied on. In addition, the qubits and the DSADC are preferably configured so as for a frequency distribution of the analog signals to be essentially centered in the $n^{th}$ Nyquist zone, as assumed in FIG. 3. Furthermore, the DSADC typically has an input bandwidth that is larger than the bandwidth of the signals obtained from the qubits.

Figure 3:
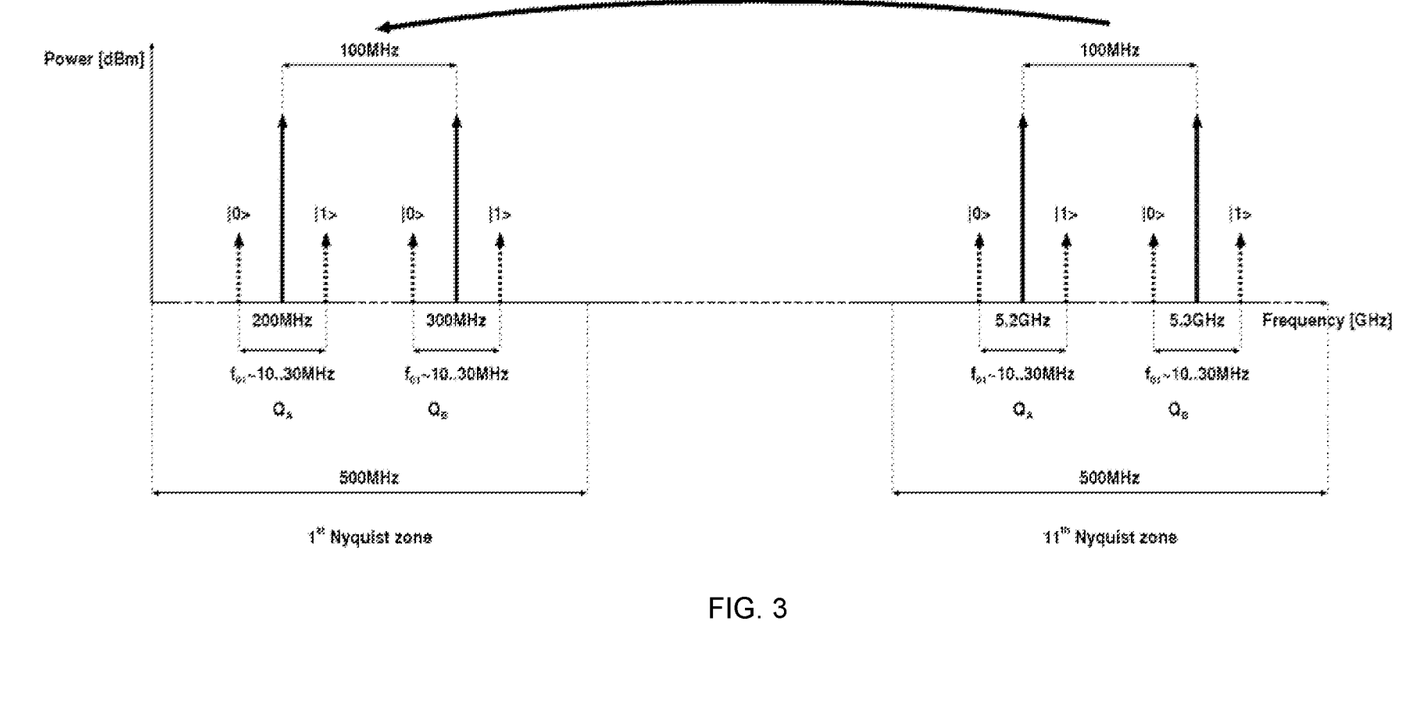
FIG. 3 illustrates the down-conversion process performed by the DSADC of FIG. 2, whereby an input signal is down-converted into the base band, as in embodiments.

For example, FIG. 3 illustrates a down-conversion process performed thanks to a DSADC, wherein the input signal (assumed to be in the range of 5.2 to 5.3 GHz, i.e., corresponding to the $11^{th}$ Nyquist zone in this example) is down-converted into the base band.

In embodiments, the qubits and the DSADC are jointly configured so as for a sampling frequency of the DSADC used to sample analog signals from the qubits to be substantially less than the average carrier frequency of such analog signals. Note, the analog signals can be obtained by first combining the signals received from the qubits with cancelation signals received from the SCU, as discussed below in reference to FIG. 4.

Figure 2:
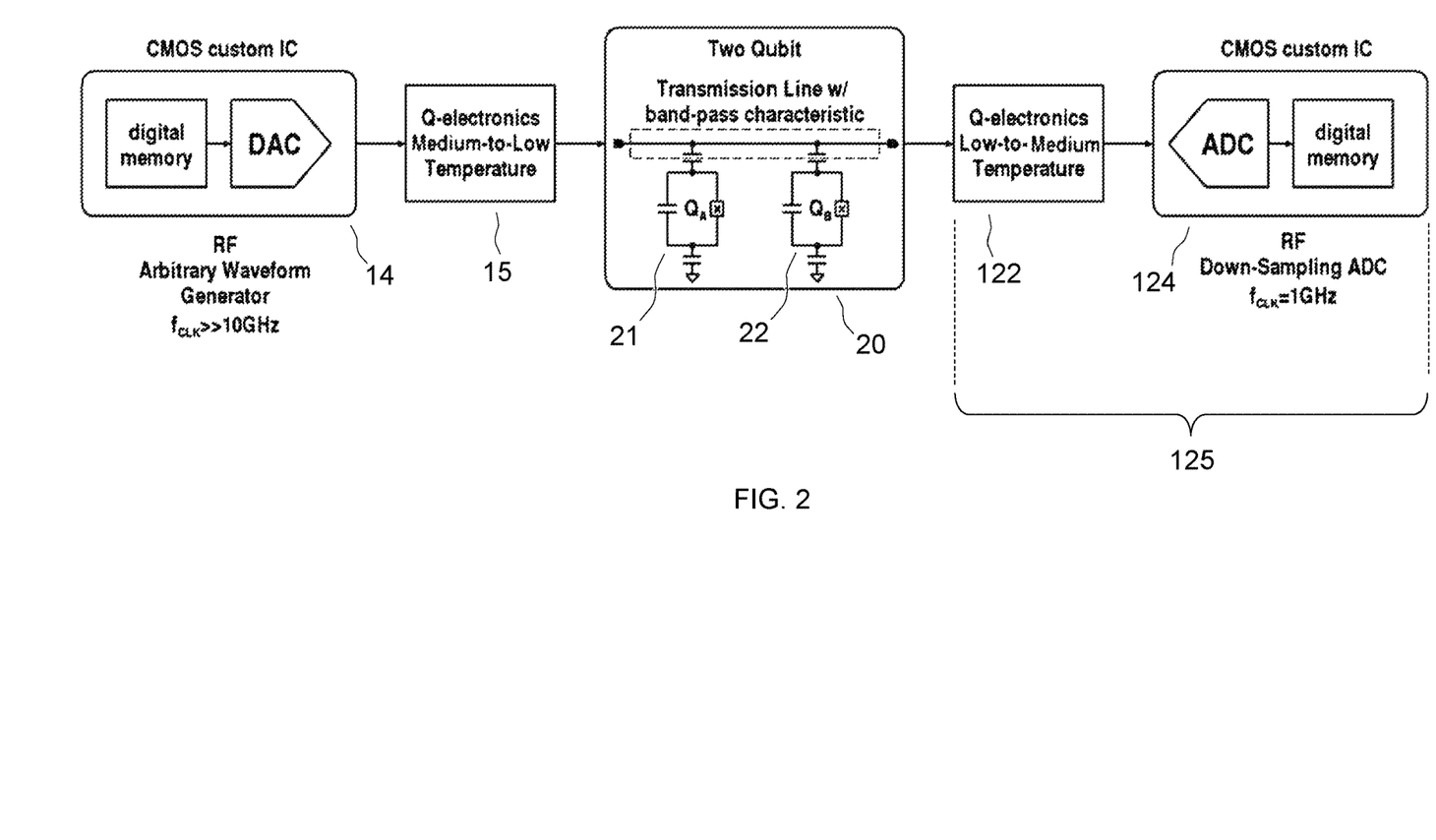
FIG. 2 illustrates how components of the signal generator, qubit electronics, and the control electronics of FIG. 1 are interconnected, in embodiments, whereby the control electronics comprise a downsampling analog-to-digital converter, or DSADC, configured to downsample analog signals obtained from the qubits.

The analog signals can possibly be multiplexed signals obtained from several of the qubits, as assumed in the embodiment of FIG. 2. In that case, the qubits and the DSADC can be configured so as for the sampling frequency to span over all frequencies of the multiplexed signals. In variants where single qubit readouts are performed, the sampling frequency need be at least twice the qubit coupling frequency. In practice, the sampling frequency will typically be between 0.5 and 3.0 giga samples per seconds (GS/s), and it preferably is less than 2 GS/s. For example, the DSADC can operate at 1 GS/s, while the qubit readout signals can typically have a frequency around 5 GHz, as assumed in FIG. 3.

Figure 4:
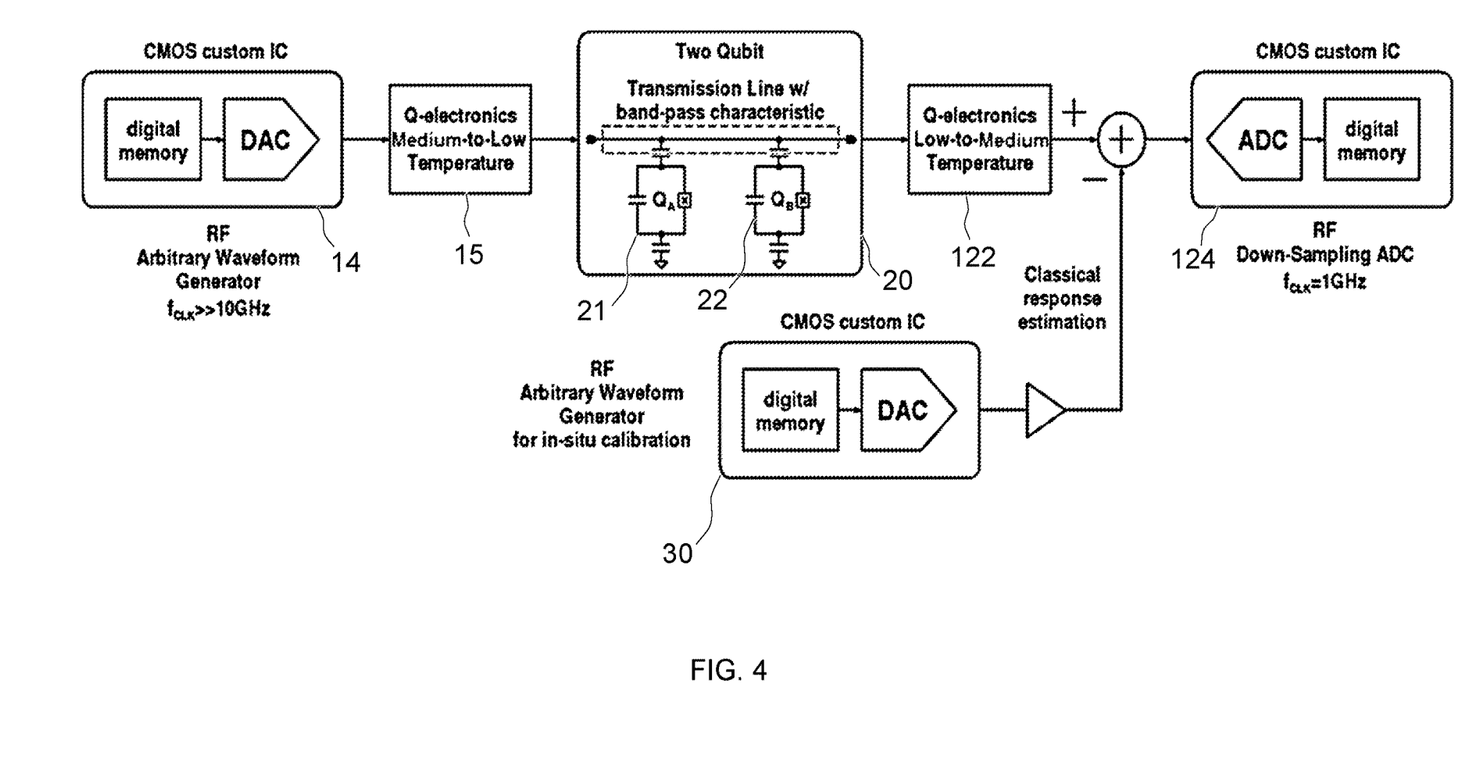
FIG. 4 is a variant to FIG. 2, wherein the control electronics additionally comprise a signal cancelation unit, as involved in embodiments.

In embodiments, the control electronics further comprise a signal cancelation unit 30, or SCU, as illustrated in FIG. 4. The SCU 30 includes an digital-to-analog converter, or DAC, and is connected to the qubits and the DSADC, so as to be able to perform signal cancelation. This notably causes to reduce the carrier amplitude of analog signals down-converted by the DSADC, prior to sampling such signals, in operation. That is, an optional DAC can be provided (as part of the SCU) in front of the receiving unit 124 to allow signal cancelation and reduce the dynamic range requirements of the DSADC 124. Without this SCU, dynamic range issues can possibly occur, especially when using an 8-bit DSADC.

The SCU 30 can be placed on the same platform as the DSADC 124. In variants, it can form part of other electronic components of the control electronics 12, on the room-temperature platform.

As further assumed in FIG. 4, the SCU is preferably connected in the readout line from the qubit, so as to allow cancelation signals emitted by the SCU to linearly combine with analog signals received from the qubits, prior to feeding the combined signals to the DSADC, where such signals are then downsampled by the DSADC, in operation. The cancelation signals from the SCU can for instance be linearly combined, by summation, with qubit readout signals before entering the DSADC. The DSADC can for example receive and process multiple time-interleaved or frequency-multiplexed qubit signals, with the SCU arranged in front of the DSADC to allow signal cancelation, as shown in FIG. 4.

The SCU can notably be configured so as for the cancelation signals to destructively interfere with residual qubit excitation signals remaining in analog signals received by the DSADC from the qubit, in operation. Also, the SCU can possibly be designed to generate cancelation signals based on, e.g., amplitude- and phase-adjusted qubit excitation signals, error compensation signals for the qubits, crosstalk compensation signals, and/or other unwanted modulation signals that would remain in analog signals transmitted by the qubits.

Next, according to another aspect, one or more embodiments of the invention can be a method of operating a quantum processing apparatus. Aspects of this method have already been implicitly described in reference to quantum processing apparatuses according to one or more embodiments of the invention; they are accordingly succinctly described in the following.

This method basically relies on a quantum processing apparatus as described earlier, i.e., comprising M solid-state qubits, M>1, and control electronics, which are connected to the qubits. Again, the control electronics can comprise one or more qubit readout circuits, where each of the circuits is connected to at least one of the qubits and comprises a DSADC.

The method revolves around downsampling, via the DSADC, analog signals obtained from the qubit(s). And as explained earlier, the DSADC operates in the $n^{th}$ Nyquist zone of the spectrum of the analog signals obtained, so as to down-convert such analog signals from the $n^{th}$ Nyquist zone to the $m^{th}$ Nyquist zone of the spectrum, where $n > m \geq 1$, prior to sampling the analog signals to convert them into digital signals.

As explained earlier, the method can further involve a SCU, in order to perform signal cancelation, so as to reduce the carrier amplitude of analog signals down-converted by the DSADC.

The above embodiments have been succinctly described in reference to the accompanying drawings and can accommodate a number of variants. Several combinations of the above features can be contemplated. Examples are given in the next section.

2. Specific Embodiments—Technical Implementation Details

"Downsampling" is closely related to "undersampling" and concerns techniques combining signal downconversion (mixing) and "analog to digital conversion" in one step. This allows a reduced bitrate in the digital domain, less power consumption, and cheaper hardware. Normally, one would use a sampling rate which is twice the highest frequency of the analog signal, owing to the Nyquist sampling criterion, i.e., $$F_s = 2 \cdot F_{analog},$$

where $F_s$ is the sampling rate and $F_{analog}$ the highest frequency of the analog signals to be digitized. If this rule is fulfilled, then digital samples contain the full information on the analog waveform. Thus, the digital signal can perfectly be converted back into the original analog signal, without losing information. Analog to digital conversion can for example be achieved using a sample-and-hold circuit, which first creates an intermediate signal, whose amplitude has a shape similar to a staircase. Next, a low-pass filter with an edge frequency of $F_s/2$ can be used to create a smooth waveform. Assuming, for example, that a 2.5 GHz signal is to be digitized, this would require a sampling rate of 5 giga samples per second (5 GS/s).

The analog spectrum can be divided into Nyquist zones that represents a series of slices of equal sub-bandwidths. Frequencies of the same Nyquist zone alias unambiguously to digital frequencies (independently of the fulfillment of the sampling theorem). The sampling theorem is fulfilled, if the analog frequencies are exclusively located in the first Nyquist zone, which extends from 0 Hz to $F_s/2$. Thus, for a 2.5 GHz signal ($F_s$=5 GS/s), the $1^{st}$ Nyquist zone extends from 0 to 2.5 GHz.

In practical applications, aliasing is not always an issue. It can also be used to sample frequencies above $F_s/2$. This technique, called undersampling (or sometimes bandpass sampling), involves sampling at a sampling rate that is too low and thus violates the sampling theorem, such that aliasing occurs intentionally. Then, frequencies that initially are above $F_s/2$ (the information in the high Nyquist zone) are shifted to lower frequencies (<$F_s/2$—typically the first Nyquist zone starting at 0 frequency). In this sense, undersampling exhibits the same behavior as a mixer, as it downshifts signals in frequency. Undersampling works fine if all analog input signals reaching the ADC belong to one and the same Nyquist zone and the track and hold circuit has enough bandwidth (the sampling operation is short and can be approximated with a Dirac pulse). For that purpose, a suitable band-pass filter can be required before AD conversion, which cuts off all frequencies from other Nyquist zones.

In the present case, if an analog signal obtained from the qubit(s) is distributed only in a small frequency range, e.g., around 2.5 GHz in the above example, sampling at a rate of 5 GS/s is not strictly needed. Instead, one can sample the signal using a much lower sampling rate and use the technique of "undersampling" described below.

Figure 5:
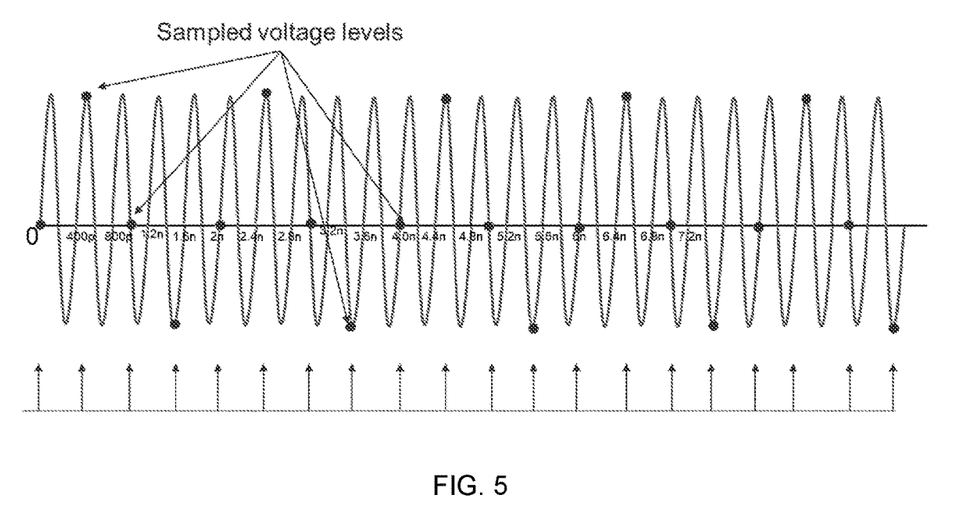
FIGS. 5 and 6 illustrate how a downconverted sine wave can be obtained (FIG. 6) from a sine wave, as involved in embodiments of the invention.

Again, assume that a 2.5 GHz signal is to be obtained (for example a sine wave, to keep things simple), while a sampling of only 2 GS/s is used (i.e., $F_s/2$=1 GHz). By construction, the first Nyquist zone extends from 0 Hz to 1 GHz and the 2.5 GHz signal is thus located in the center of the third Nyquist zone. FIG. 5 shows the 2.5 GHz sine wave and the sampling points for 2 GS/s in the time domain. Arrows in the lower part of the drawings indicates the timing for the sampled voltage, which are denoted by points overlaid on the sine wave.

In principle, the sampling frequency should be at least 5 GS/s. When using instead a sampling frequency of 2 GS/s, one ends up sampling at 0, 500p, 1n, 1.5 p, etc., where p and n stands for pico and nano seconds, respectively (1 ns=$10^{-9}$ s, 1 ps=$10^{-12}$ s).

Figure 6:
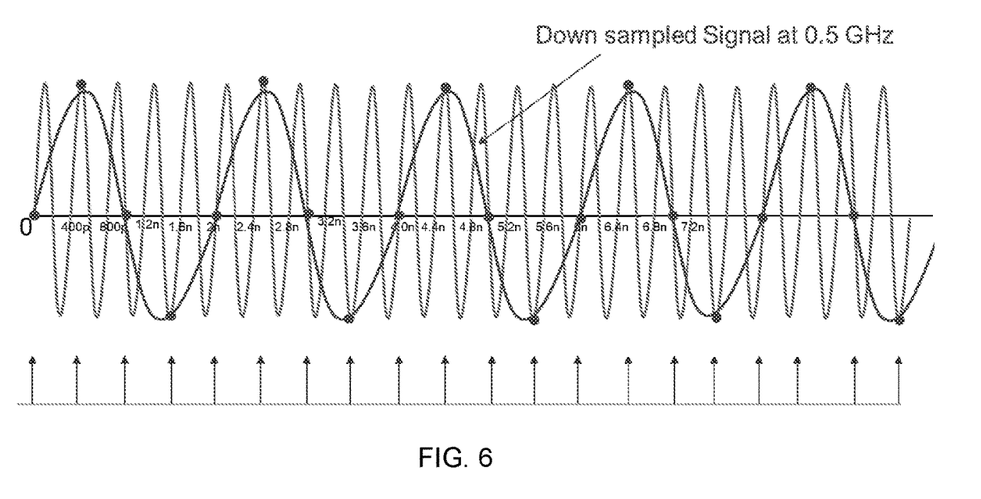

If we connect the dots corresponding to the sampled points (e.g., a low-pass filter), we obtain a downconverted sine wave of 500 MHz, located in the first Nyquist zone, as illustrated in FIG. 6, which shows the downsampled sine wave (in the $1^{st}$ Nyquist zone) overlaid on the initial sine wave.

One preferably make sure that the following conditions are fulfilled. First, the relation $F_{3\ db}=F_s/2=1$ GHz is only obtained only after low-pass filtering, whereby a sine wave of 500 MHz is obtained. All signals should be in one Nyquist zone, to prevent aliasing. It is further desirable to have the signals contained in one of the odd Nyquist zones, to avoid a frequency inversion. The signal should thus preferably be located at or about the center of the $n^{th}$ Nyquist zone. For example, for a sampling rate of 2 GS/s, the first Nyquist zone will end at 1 GHz (zero amplitude), the second zone at 2 GHz (maximum amplitude), the third zone at 3 GHz, and so on. Thus, all the odd-numbered zones can shift without frequency mirroring to the first zone. The third zone starting at 2 GHz (up to 3 GHz) will be shifted to the band 0 Hz to 1 GHz. A band-pass filter might be used to make sure there is no signals remaining in the other Nyquist zones, to avoid aliasing. However, when considering signals transmitted by solid-state qubits, no signal is typically seen in the other Nyquist zones.

While embodiments of the present invention have been described with reference to a limited number of embodiments, variants and the accompanying drawings, it will be understood by those skilled in the art that various changes may be made and equivalents may be substituted without departing from the scope of one or more embodiments of the present invention. In particular, a feature (device-like or method-like) recited in a given embodiment, variant or shown in a drawing may be combined with or replace another feature in another embodiment, variant or drawing, without departing from the scope of one or more embodiments of the present invention. Various combinations of the features described in respect of any of the above embodiments or variants may accordingly be contemplated, that remain within the scope of the appended claims. In addition, many minor modifications may be made to adapt a particular situation or material to the teachings of one or more embodiments of the present invention without departing from its scope. Therefore, it is intended that one or more embodiments of the present invention not be limited to the particular embodiments disclosed, but that one or more embodiments of the present invention will include all embodiments falling within the scope of the appended claims. In addition, many other variants than explicitly touched above can be contemplated.

What is claimed is:

1. A quantum processing apparatus comprising:
M solid-state qubits, M>1; and
control electronics, which are connected to the M solid-state qubits,
wherein the control electronics comprise one or more qubit readout circuits, each of the one or more qubit readout circuits connected to at least one of the M solid-state qubits and comprising a downsampling analog-to-digital converter (DSADC), and
wherein the DSADC downsamples analog signals obtained from the at least one of the M solid-state qubits, whereby the DSADC operates in an $n^{th}$ Nyquist zone of a spectrum of the analog signals, so as to down-convert such analog signals from the $n^{th}$ Nyquist zone to an $m^{th}$ Nyquist zone of the spectrum, n>m≥1, prior to sampling the analog signals to convert them into digital signals, in operation.

2. The quantum processing apparatus of claim 1, wherein the M solid-state qubits and the DSADC are configured so as for the analog signals to be included in the $n^{th}$ Nyquist zone and down-converted analog signals to be included in the $M^{th}$ Nyquist zone, in operation.

3. The quantum processing apparatus of claim 1, wherein each of n and m is an odd number.

4. The quantum processing apparatus of claim 3, wherein m=1.

5. The quantum processing apparatus of claim 3, wherein n≥5.

6. The quantum processing apparatus of claim 1, wherein the M solid-state qubits and the DSADC are configured so as for a frequency distribution of the analog signals to be centered in the $n^{th}$ Nyquist zone, in operation.

7. The quantum processing apparatus of claim 1, wherein the M solid-state qubits and the DSADC are configured so as for a sampling frequency of the DSADC used to sample the analog signals to be substantially less than an average carrier frequency of the analog signals obtained from the at least one of the M solid-state qubits, in operation.

8. The quantum processing apparatus of claim 7, wherein the analog signals are multiplexed signals obtained from several of the M solid-state qubits, and the M solid-state qubits and the DSADC are configured so as for the sampling frequency to span over all frequencies of the multiplexed signals, in operation.

9. The quantum processing apparatus of claim 7, wherein the M solid-state qubits and the DSADC are configured so as for the sampling frequency to be between 0.5 and 3.0 giga samples per seconds, in operation.

10. The quantum processing apparatus of claim 1, wherein the DSADC comprises both an analog-to-digital converter, or ADC, and a digital memory connected to the ADC.

11. The quantum processing apparatus of claim 1, wherein the control electronics further comprise a signal cancelation unit (SCU) which includes an digital-to-analog converter (DAC) and is connected to the at least one of the M solid-state qubits and the DSADC to perform signal cancelation, so as to reduce a carrier amplitude of analog signals down-converted by the DSADC, prior to sampling such signals, in operation.

12. The quantum processing apparatus of claim 11, wherein the SCU is connected so as to allow cancelation signals emitted by the SCU to linearly combine with analog signals received from the at least one of the M solid-state qubits, so as to obtain combined signals which are then downsampled by the DSADC, in operation.

13. The quantum processing apparatus of claim 11, wherein the SCU is configured such that cancelation signals destructively interfere with residual qubit excitation signals remaining in the analog signals received from the at least one of the M solid-state qubits, in operation.

14. The quantum processing apparatus of claim 11, wherein the SCU is configured such that cancelation signals are based on one or more of: amplitude- and phase-adjusted qubit excitation signals, error compensation signals for the M solid-state qubits, crosstalk compensation signals or unwanted modulation signals, as remaining in the analog signals received from the at least one of the M solid-state qubits, in operation.

15. The quantum processing apparatus of claim 1, wherein the M solid-state qubits comprises two or more qubits, whereby each of the one or more qubit readout circuits is connected to two or more of the M solid-state qubits, and the DSADC is further configured to downsample time-interleaved and/or frequency-multiplexed analog signals obtained from the two or more qubits.

16. The quantum processing apparatus of claim 1, wherein the DSADC has a larger input bandwidth than a bandwidth of the signals obtained from the at least one of the M solid-state qubits.

17. The quantum processing apparatus of claim 1, wherein the quantum processing apparatus comprises at least three platforms, including a first platform designed to be cooled down at a first temperature, a second platform designed to be cooled down at a second temperature that is larger than the first temperature, and a third platform designed to be operated at a third temperature that is larger than the second temperature, and wherein the M solid-state qubits are arranged on the first platform, and the control electronics comprise electronic components arranged on the second platform or the third platform.

18. The quantum processing apparatus of claim 17, wherein the DSADC is arranged on the second platform.

19. The quantum processing apparatus of claim 18, wherein the third platform is adapted to be operated at room temperature and the second platform is designed to be cooled down at a temperature that is between 2 and 6 Kelvin (K), in operation.

20. A computer-implemented method of operating a quantum processing apparatus, the method comprising:
    employing a quantum processing apparatus, wherein the quantum processing apparatus comprises M solid-state qubits, M>1, and control electronics, which are connected to the M solid-state qubits, wherein the control electronics comprise one or more qubit readout circuits, each of the one or more qubit readout circuits connected to at least one of the M solid-state qubits and comprising a downsampling analog-to-digital converter (DSADC); and
    via the DSADC, downsampling analog signals obtained from the at least one of the M solid-state qubits, the DSADC operating in an $n^{th}$ Nyquist zone of a spectrum of the analog signals, so as to down-convert such analog signals from the $n^{th}$ Nyquist zone to an $m^{th}$ Nyquist zone of the spectrum, $n > m \geq 1$, prior to sampling the analog signals to convert them into digital signals.

* * * * *